US008779649B2

(12) United States Patent
Sakai

(10) Patent No.: US 8,779,649 B2
(45) Date of Patent: Jul. 15, 2014

(54) ULTRASONIC TRANSDUCER

(75) Inventor: Hironori Sakai, Nagaokakyo (JP)

(73) Assignee: Murata Manufacturing Co., Ltd., Nagaokakyo-Shi, Kyoto-fu (JP)

( * ) Notice: Subject to any disclaimer, the term of this patent is extended or adjusted under 35 U.S.C. 154(b) by 385 days.

(21) Appl. No.: 13/225,607

(22) Filed: Sep. 6, 2011

(65) Prior Publication Data

US 2012/0056511 A1 Mar. 8, 2012

(30) Foreign Application Priority Data

Sep. 8, 2010 (JP) ................................ 2010-200965

(51) Int. Cl.
*H01L 41/053* (2006.01)

(52) U.S. Cl.
USPC ........... 310/328; 310/326; 310/311; 310/348

(58) Field of Classification Search
USPC ................................ 310/311, 326–328, 348
See application file for complete search history.

(56) References Cited

U.S. PATENT DOCUMENTS 2,728,869 A * 12/1955 Reimar Pohlman .......... 310/334
5,612,930 A 3/1997 Hazony et al.
6,467,138 B1 * 10/2002 Aime .......................... 29/25.35
6,700,304 B1 * 3/2004 Fuller et al. .................. 310/321
7,103,960 B2 * 9/2006 Aime ............................ 29/594
7,176,602 B2 * 2/2007 Schlenke ...................... 310/348
7,548,014 B2 * 6/2009 Asada et al. .................. 310/348
7,956,516 B2 * 6/2011 Hayashi et al. ............... 310/334
7,973,455 B2 7/2011 Ota
2009/0302712 A1 12/2009 Ota

FOREIGN PATENT DOCUMENTS

| | | | |
|---|---|---|---|
| CN | 101258771 | A | 9/2008 |
| JP | 58-161376 | A | 9/1983 |
| JP | S58-161376 | U | 10/1983 |
| JP | 1998-041675 | | 2/1998 |
| JP | 11-266498 | A | 9/1999 |
| JP | 2001-050940 | A | 2/2001 |
| JP | 2002-078090 | A | 3/2002 |
| WO | WO-97/16260 | A1 | 5/1997 |
| WO | WO-2007-029559 | A1 | 3/2007 |

* cited by examiner

*Primary Examiner* — Thomas Dougherty
(74) *Attorney, Agent, or Firm* — Dickstein Shapiro LLP

(57) ABSTRACT

An ultrasonic transducer includes a case having a closed end in the main axis direction, a piezoelectric element located substantially at the center of the closed end of the case, and a body arranged inside the case so as to be opposed to the piezoelectric element. The body has an irregular surface opposed to and spaced from the piezoelectric element.

20 Claims, 12 Drawing Sheets

ULTRASONIC TRANSDUCER

BACKGROUND OF THE INVENTION

1. Field of the Invention

The present invention relates to an ultrasonic transducer that transmits or receives ultrasonic waves.

2. Description of the Related Art

Ultrasonic transducers are used as back sonar of automobiles. Ultrasonic transducers according to the related art include a case having a bottomed, substantially cylindrical shape that is closed at an end in the main axis direction, a piezoelectric element bonded to the inner bottom surface of the case, resin that blocks the opening of the case, and the like. Ultrasonic transducers apply a driving voltage to the piezoelectric element to cause the piezoelectric element and the case to vibrate to thereby transmit ultrasonic waves toward the outside of the case, receive reflected waves bounced back from a target, and measure the reflection time, thereby measuring the distance to the target.

In such ultrasonic transducers, ultrasonic waves are transmitted not only toward the outside of the case but also toward the inside of the case. The ultrasonic waves transmitted toward the inside of the case bounce back toward the piezoelectric element upon reaching the resin, causing the piezoelectric element to vibrate again. These excess vibrations are recognized as reverberation. Generally, in such a case, the reverberation time of the ultrasonic transducers tends to become long since the ultrasonic waves undergo multiple reflections several dozen times between the resin and the piezoelectric element. Longer reverberation time makes short-distance detection more difficult.

An ultrasonic transducer that can solve such a problem is disclosed in International Publication No. 2007/029559, for example. As shown in FIG. 12, an ultrasonic transducer 700 disclosed in International Publication No. 2007/029559 includes a case body 71, a piezoelectric element 72, a base substrate 73, lead wires 74, external connection terminals 75, and a sound-absorbing material 70.

The case body 71 has a bottomed, substantially cylindrical shape that is closed at an end in the main axis direction, and is formed from metal. The case body 71 includes an outer case 76 having a bottomed, substantially cylindrical shape, and an inner case 77 having a substantially cylindrical shape provided on the inner periphery of the outer case 76. The piezoelectric element 72 is bonded to the inner bottom surface of the case body 71.

The sound-absorbing material 70 is opposed to the piezoelectric element 72, and is placed in the space inside the case body 71 at a spacing from the piezoelectric element 72 so that the sound-absorbing material 70 does not come into contact with the main surface of the piezoelectric element 72. The sound-absorbing material 70 is formed from porous silicone.

The base substrate 73 is provided on the other main surface of the sound-absorbing material 70. Two lead wires 74 are connected to the base substrate 73, one to one electrode of the piezoelectric element 72, the other to the case body 71. Also, two external connection terminals 75 connected to the lead wires 74 are connected to the base substrate 73. The external connection terminals 75 are led out to the outside of the case body 71.

The related art illustrated in FIG. 12 achieves an improvement in reverberation characteristic by provision of the sound-absorbing material in the interior of the case. However, even such a measure cannot completely eliminate reverberation of ultrasonic waves. In some cases, a further improvement in reverberation characteristic is desired.

SUMMARY OF THE INVENTION

Accordingly, it is an object of the present invention to provide an ultrasonic transducer that enables a further improvement in reverberation characteristic over the related art.

To solve the above-mentioned problem, according to preferred embodiments of the present invention, there is provided an ultrasonic transducer including a case having a bottomed, substantially cylindrical shape that is closed at an end in a main axis direction, a piezoelectric element bonded to a center of an inner bottom of the case, and a molded body arranged inside the case so as to be opposed to the piezoelectric element, in which the molded body has a large number of irregularities formed in one main surface opposed to the piezoelectric element, and at least the large number of irregularities are spaced apart from the piezoelectric element. With this configuration, ultrasonic waves produced in the direction toward the inside of the case can be diffuse-reflected. Since the diffuse-reflected ultrasonic waves are less likely to bounce back directly toward the piezoelectric element, multiple reflections are less likely to occur between the molded body and the piezoelectric element. In addition, ultrasonic signals are attenuated with every reflection, thereby improving the reverberation characteristic with respect to the direction toward the inside of the case.

According to preferred embodiments of the present invention, the large number of irregularities are formed in a substantially pyramidal shape. In this case, manufacture and machining of the molded body and the mold for forming the molded body become easy, thus facilitating management.

According to preferred embodiments of the present invention, the large number of irregularities are formed in a substantially truncated pyramidal shape. In this case, manufacture and machining of the molded body become easy.

According to preferred embodiments of the present invention, the molded body has a plurality of legs formed around an outer periphery of the large number of irregularities, and the legs are in contact with the inner bottom of the case. In this case, vibration of the case can be suppressed by the legs, thereby making it possible to suppress reverberation. Moreover, the accuracy of the distance from the bottom surface of the case to the large number of irregularities in the molded body can be enhanced.

According to preferred embodiments of the present invention, the molded body has a protrusion formed around the outer periphery of the large number of irregularities, and the protrusion is in contact with a main surface of the piezoelectric element. In this case, the level of vibration of the piezoelectric element can be suppressed to some extent, which likewise makes it possible to suppress the level of reverberation.

According to preferred embodiments of the present invention, in the molded body, a distance between a farthest location of the large number of irregularities from the piezoelectric element and the piezoelectric element is not more than a ¼ wavelength of ultrasonic waves used. In this case, ultrasonic waves and reflected waves produced in the direction toward the inside of the case act to cancel each other out, making attenuation of the ultrasonic waves faster, thereby further suppressing reverberation.

Other features, elements, characteristics and advantages of the present invention will become more apparent from the following detailed description of preferred embodiments of the present invention with reference to the attached drawings.

DESCRIPTION OF THE PREFERRED EMBODIMENTS

Figure 1:
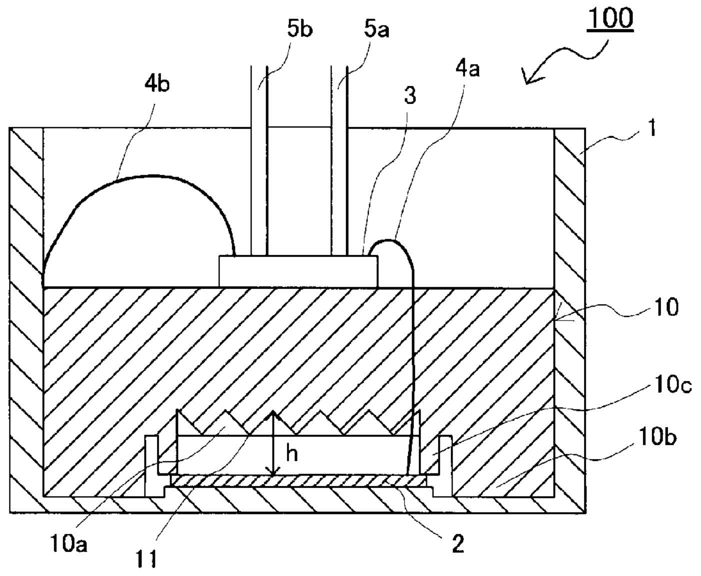
FIG. 1 is a cross-sectional view of an ultrasonic transducer according to Embodiment 1 of the present invention.

Hereinbelow, an ultrasonic transducer according to each of embodiments of the present invention will be described.

Embodiment 1

Hereinbelow, Embodiment 1 will be described with reference to FIGS. 1 to 4. An ultrasonic transducer 100 according to Embodiment 1 includes a case 1, a piezoelectric element 2, a base substrate 3, lead wires 4*a* and 4*b*, external connection terminals 5*a* and 5*b*, and a molded body 10.

Figure 2:
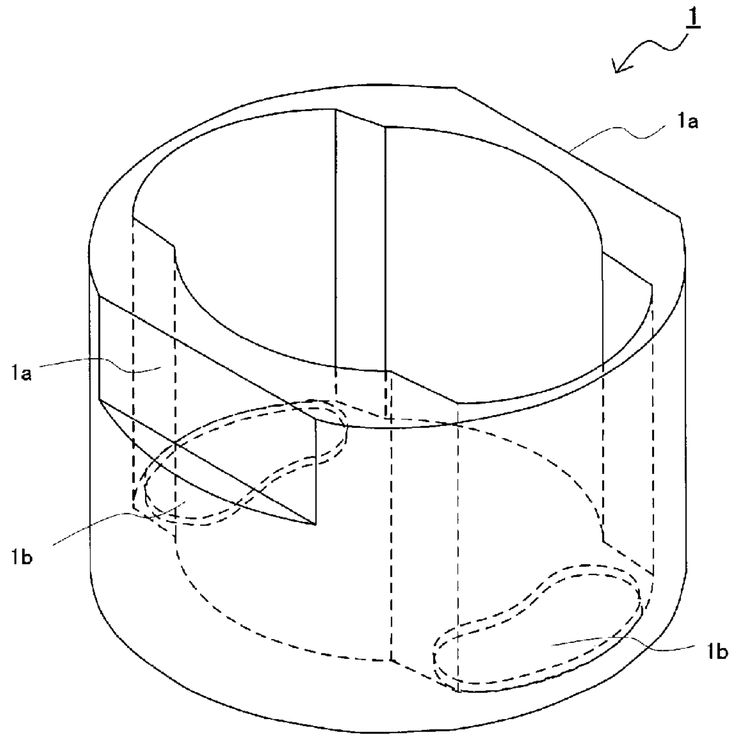
FIG. 2 is a perspective view of a case of the ultrasonic transducer according to Embodiment 1.

As shown in FIGS. 1 and 2, the case 1 has a bottomed, substantially cylindrical shape that is closed at an end in the main axis direction, and is formed from, for example, a metallic material such as aluminum. The inner bottom surface of the case 1 is formed in a substantially elliptic shape, with recesses 1*b* formed at both ends along the major axis. Also, on the opening side of the outer periphery of the case 1 and at both ends along the minor axis, cutouts 1*a* are provided so as to be opposed to each other.

The piezoelectric element 2 has electrodes (not shown) provided on both sides, and is bonded to the center of the inner bottom surface of the case 1.

Figure 3:
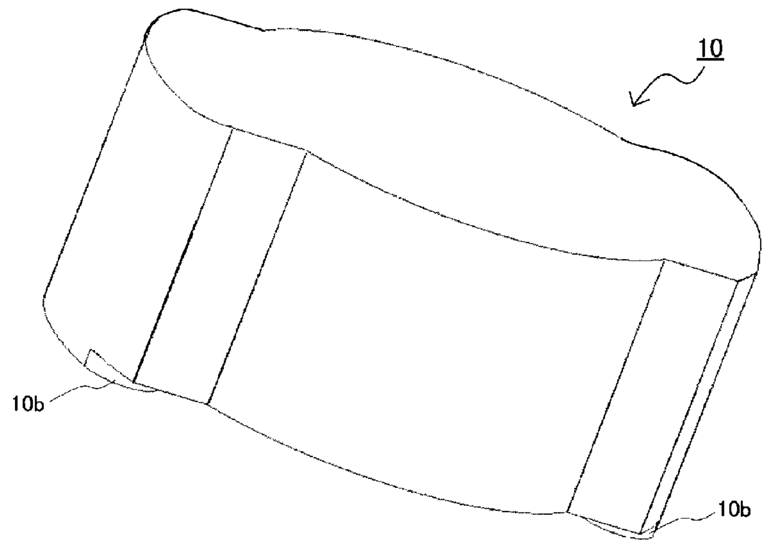
FIG. 3 is a perspective view of a molded body of the ultrasonic transducer according to Embodiment 1.

As shown in FIG. 3, the molded body 10 is formed in a substantially elliptic shape so as to fit into the case 1. The molded body 10 is formed from, for example, silicone resin.

Figure 4:
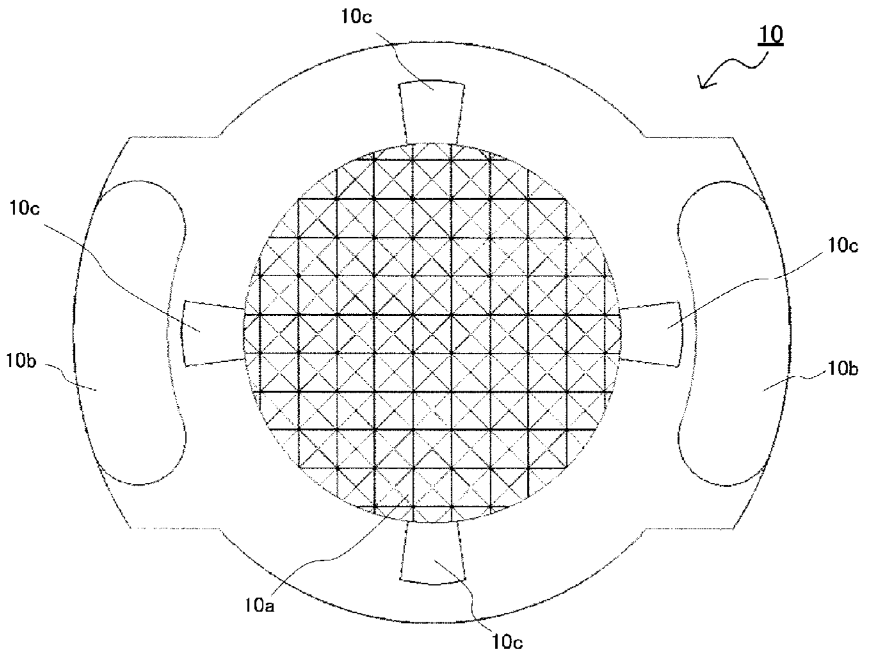
FIG. 4 is a bottom view of the molded body of the ultrasonic transducer according to Embodiment 1.

As shown in FIG. 4, the lower part of the molded body 10 is formed in a substantially elliptic cylindrical shape, and is provided with a large number of substantially pyramidal recesses 10*a*, legs 10*b*, and protrusions 10*c*.

Specifically, the large number of substantially pyramidal recesses 10*a* are provided in a substantially circular region at the center of the lower part of the molded body 10, and are formed at regular intervals in a substantially grid pattern. As shown in FIG. 1, the molded body 10 is placed in the interior of the case 1 in such a way that a large number of irregularities 11 do not come into contact with the piezoelectric element 2. The shape of the substantially pyramidal recesses 10*a* is substantially a square pyramid.

The legs 10*b* are provided at two locations around the outer periphery of the irregularities 11. The legs 10*b* are so formed as to fit into the recesses 1*b* provided at the inner bottom of the case 1. With this configuration, vibration of the case 1 can be suppressed by the legs 10*b*, thereby making it possible to suppress reverberation. Moreover, the accuracy of the distance from the inner bottom of the case 1 to the substantially pyramidal recesses 10*a* can be enhanced.

The protrusions 10*c* are provided around the outer periphery of the irregularities 11 at, for example, four locations in this embodiment. The protrusions 10*c* are set to such a height that allows the protrusions 10*c* to contact a part of the outer periphery of the piezoelectric element 2. Although reducing the overall sensitivity of the ultrasonic transducer 100 to a degree that causes no problem in practical use, such a configuration enhances the reverberation characteristic at the same time.

As shown in FIG. 1, the base substrate 3 is placed at the center on the other main surface of the molded body 10. The piezoelectric element 2 and the base substrate 3 are connected to each other by the lead wire 4*a*, and the case 1 and the base substrate 3 are connected to each other by the lead wire 4*b*. The lead wire 4*a* and the lead wire 4*b* are connected to the external connection terminal 5*a* and the external connection terminal 5*b*, respectively. The external connection terminals 5*a* and 5*b* are led out to the outside of the case 1.

The space from the outer main surface of the molded body 10 to the opening of the case 1 is filled with a filler (not shown) and thus formed as a drip-proof structure that prevents entry of water droplets, foreign matter, and the like.

Operation of the ultrasonic transducer 100 will be illustrated below.

The ultrasonic transducer 100 according to the present invention has both transmit and receive capabilities. The piezoelectric element 2 is excited by applying a driving voltage to the piezoelectric 2 at its natural frequency. This embodiment assumes frequencies from about 40 KHz to 400 KHz. First, ultrasonic waves are transmitted from the bottom surface of the case 1 toward the outside of the case 1. Upon reaching an obstacle, some of the transmitted ultrasonic waves are reflected as reflected waves toward the ultrasonic transducer 100. When the bottom surface of the case 1 receives the reflected waves, the bottom surface undergoes natural vibration, which causes the piezoelectric element 2 to vibrate, thereby obtaining an electromotive force. The distance to the obstacle is detected from the time it takes from transmitting ultrasonic waves to receiving reflected waves in this way.

On the other hand, when the piezoelectric element 2 is excited, ultrasonic waves are produced also in the direction toward the inside of the case 1. When the ultrasonic waves reach the molded body 10 after propagating through the air above the piezoelectric element 2 as a medium, due to the difference in acoustic impedance between the air and the molded body 10, reflective and absorptive actions are exerted on one main surface of the molded body 10 which is opposed to the piezoelectric element 2. Since a large number of irregularities are formed in the one main surface of the molded body 10 configured in this way, a high proportion of the ultrasonic waves produced from the case 1 undergoes diffuse reflection.

In this embodiment, the large number of substantially pyramidal recesses 10*a* are formed in the one main surface opposed to the piezoelectric element 2, and at least the large number of irregularities 11 are spaced apart from the piezoelectric element 2. With this configuration, when ultrasonic waves produced in the direction toward the inside of the case 1 reach the molded body 10 after propagating though the air above the piezoelectric element 2 as a medium, and are reflected by the surface of the molded body 10, the ultrasonic waves can be diffuse-reflected. Since the diffuse-reflected ultrasonic waves are less likely to bounce back directly toward the piezoelectric element, multiple reflections are less likely to occur between the molded body and the piezoelectric element. In addition, since ultrasonic signals are attenuated with every reflection, the reverberation characteristic of the case improves. Moreover, manufacture and machining of the molded body and the mold for forming the molded body become easy, thus facilitating management.

In the related art, the molded body 10 is formed to be in one size larger than the case 1, and press-fitted into the case 1 to adjust its height. According to this embodiment, the plurality of legs 10*b* are formed around the outer periphery of the large number of irregularities 11 in the molded body 10, and the legs 10*b* are in contact with the inner bottom of the case 1. Thus, vibration of the case 1 can be suppressed, thereby suppressing reverberation. In addition, the accuracy of the distance from the inner bottom of the case 1 to the substantially pyramidal recesses 10*a* can be enhanced.

In this embodiment, the protrusions 10*c* are formed around the outer periphery of the large number of irregularities 11 in the molded body 10, and the protrusions 10*c* are in contact with the main surface of the piezoelectric element 2. This configuration makes it possible to suppress the level of vibration of the piezoelectric element 2 to some extent, which likewise makes it possible to suppress the level of reverberation produced from the piezoelectric element 2.

In this embodiment, the distance between the farthest location of the large number of irregularities 11 in the molded body 10 from the piezoelectric element 2 and the piezoelectric element 2 is not larger than the ¼ wavelength of the ultrasonic waves used. With this configuration, the produced ultrasonic waves and reflected waves act to cancel each other out, making attenuation of the ultrasonic waves faster, thereby further suppressing reverberation.

While in this embodiment the molded body 10 is molded in a substantially elliptic shape as shown in FIG. 2, this should not be construed restrictively.

While in this embodiment the one main surface of the molded body 10 opposed to the piezoelectric element is provided with the substantially pyramidal recesses 10*a* to form the large number of irregularities 11, this should not be construed restrictively. For example, substantially semicircular recesses may be provided, or projections may be provided to form the large number of irregularities 11.

While in this embodiment the shape of the substantially pyramidal recesses 10*a* is substantially a square pyramid, this should not be construed restrictively. For example, the shape of the substantially pyramidal recesses 10*a* may be substantially a cone, a triangular pyramid, or an octagonal pyramid.

Experimental Example 1 and Comparative Example 1

Figure 5A:
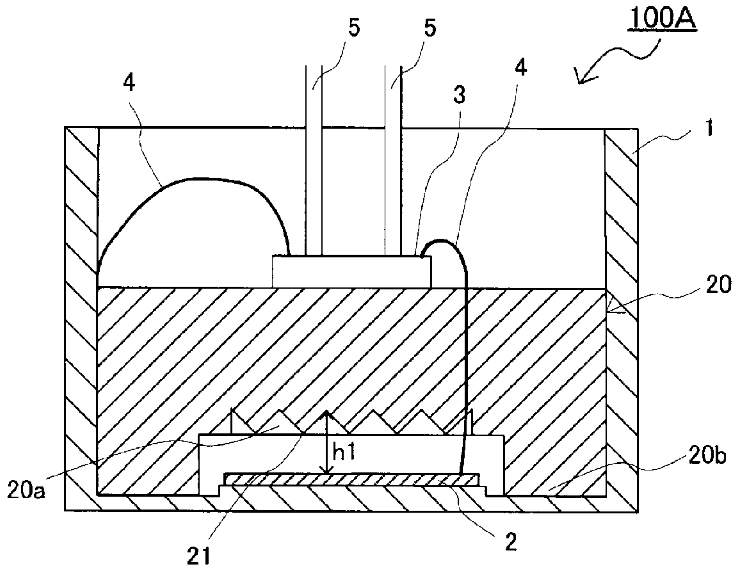
FIGS. 5A and 5B are schematic cross-sectional views of an ultrasonic transducer according to Experimental Example 1 and Comparative Example 1, respectively.
Figure 5B:
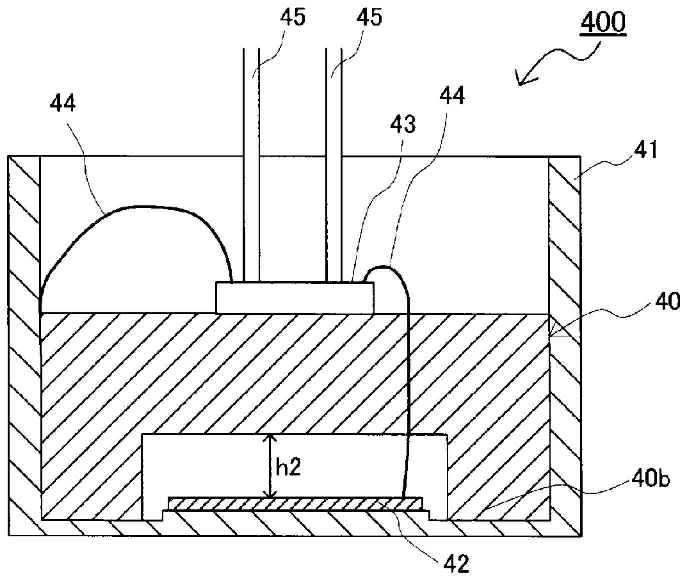

An experiment was conducted by using a transducer 100A shown in FIG. 5A as Experimental Example 1, and by using a transducer 400 shown in FIG. 5B as Comparative Example 1. In Experimental Example 1, the protrusions 10*c* are omitted from the molded body 10 according to Embodiment 1 described above. Portions other than the molded body 10 which are the same as those in Embodiment 1 are denoted by the same symbols and repetitive description is omitted.

As shown in FIG. 5A, in the transducer 100A according to Experimental Example 1, as in Embodiment 1, legs 20*b* are formed in a molded body 20, and a large number of substantially pyramidal recesses 20*a* are provided in the main surface of the molded body 20 to form a large number of irregularities 21. The substantially pyramidal recesses 20*a* are provided in the shape of a substantially square pyramid. A distance h1 indicates the distance from the farthest location of the large number of irregularities 21 from the piezoelectric element 2, to the piezoelectric element 2. The distance at this time is 0.65 mm.

As shown in FIG. 5B, in the transducer 400 according to Comparative Example 1, legs 40*b* are formed in a molded body 40, and the main surface of the molded body 40 is a planar surface with no irregularities. A distance h2 indicates the distance from the main surface of the molded body 40 opposed to a piezoelectric element 42, to the piezoelectric element 42. The distance at this time is 0.65 mm.

TABLE 1

| Condition | Shape of main surface of molded body | Distance (mm) |
|---|---|---|
| Experimental Example 1 | Irregular | 0.65 |
| Comparative Example 1 | Planar | 0.65 |

An experiment was conducted under the conditions shown in Table 1. In this experiment, under these two conditions, reverberation characteristics were measured and compared. At this time, the room temperature is about 25° C. The reverberation characteristic refers to the time it takes from when ultrasonic waves are outputted to when vibration of the piezoelectric element dies out.

Figure 6:
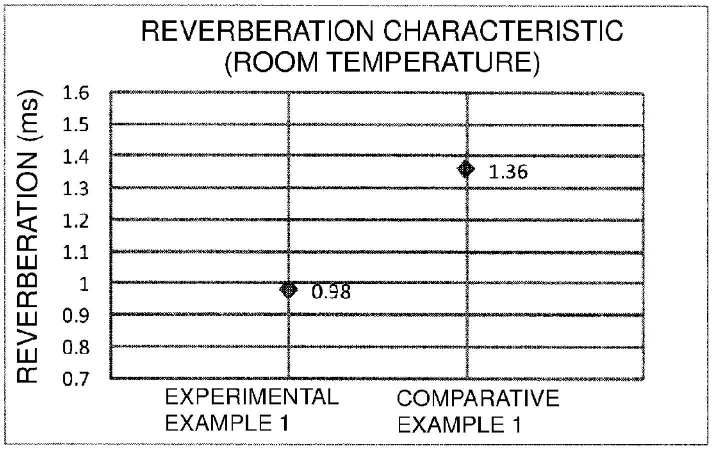
FIG. 6 is a diagram showing reverberation characteristics based on Experimental Example 1 and Comparative Example 1 respectively shown in FIGS. 5A and 5B.

FIG. 6 shows the experiment results. The number of samples used for the experiment is 5. Numerical values in the drawing indicate average values. The average value of reverberation characteristic according to Experimental Example 1 is 0.98 ms, and the average value of reverberation characteristic according to Comparative Example 1 is 1.36 ms. It should be noted that the value of reverberation characteristic required for an ultrasonic transducer is, for example, about 1.4 ms or less at room temperature.

From the above results, both Experimental Example 1 and Comparative Example 1 satisfy a desired condition with respect to the value of reverberation characteristic. However, comparison between Experimental Example 1 and Comparative Example 1 reveals that Experimental Example 1 exhibits a superior reverberation characteristic at room temperature over the comparative example. That is, it can be said that the reverberation characteristic improves if a large number of irregularities are formed in one main surface of the molded body.

Experimental Examples 2 to 10 and Comparative Example 2

The structure according to Experimental Example 2 is the same as that of the ultrasonic transducer 100 according to Embodiment 1. As shown in FIG. 1, a large number of substantially pyramidal recesses 10*a* are provided in the main surface of a molded body 10 to form a large number of irregularities 11. The substantially pyramidal recesses 10*a* are provided in the shape of a substantially square pyramid. Legs 10*b* and protrusions 10*c* are formed in the molded body 10. As shown in FIG. 4, the protrusions 10*c* are provided at four locations around the outer periphery of the substantially pyramidal recesses 10*a*. A distance h indicates the distance from the farthest location of the substantially pyramidal recesses 10*a* from the piezoelectric element 2, to the piezoelectric element 2. The distance at this time is 0.65 mm.

TABLE 2

| Condition | Shape of main surface of molded body | Number of Protrusions | Distance (mm) |
|---|---|---|---|
| Experimental Example 2 | Irregular | 4 | 0.65 |
| Experimental Example 3 | Irregular | 4 | 2.13 (λ/4) |
| Experimental Example 4 | Irregular | 4 | 0.95 |
| Experimental Example 5 | Irregular | 4 | 0.80 |
| Experimental Example 6 | Irregular | 1 (entire outer periphery) | 0.65 |
| Experimental Example 7 | Irregular | 12 | 0.65 |
| Experimental Example 8 | Irregular | 8 | 0.65 |
| Experimental Example 9 | Irregular | 6 | 0.65 |
| Experimental Example 10 | Irregular | 0 | 0.65 |
| Comparative Example 2 | Irregular | 4 | 0.50 |

As shown in Table 2, Experimental Examples 3 to 5, and Comparative Example 2 are samples that differ from Experimental Example 2 in the distance h between the molded body 10 and the piezoelectric element 2. The reverberation characteristics and overall sensitivities of these samples at room temperature are measured and compared with each other. At this time, the room temperature is about 25° C. The reverberation characteristic refers to the time it takes from when ultrasonic waves are outputted to when vibration of the piezoelectric element dies out. The overall sensitivity refers to the peak voltage value of the received reflected waves.

The distance h indicates the distance from the farthest location of the substantially pyramidal recesses 10*a* from the piezoelectric element 2, to the piezoelectric element 2. In this experimental example, verification is conducted by changing the condition from 2.13 mm, which is the ¼ wavelength of the ultrasonic transducer used, to 0.50 mm at which the molded body 10 comes into contact with the piezoelectric element 2.

Figure 7:
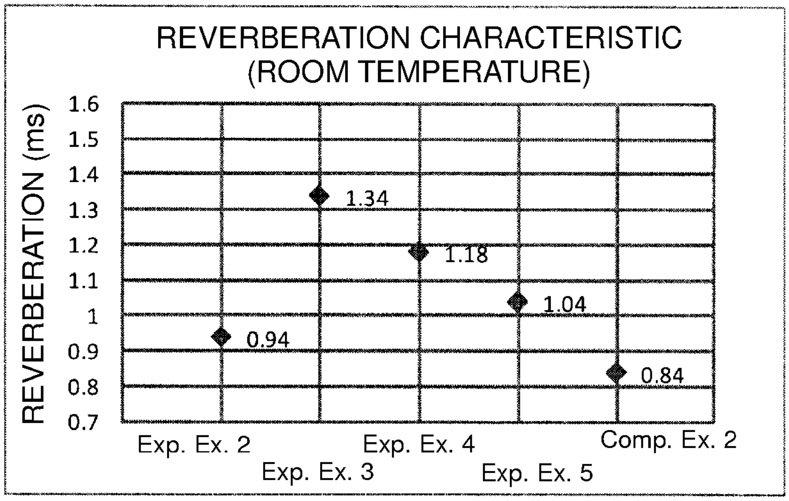
FIG. 7 is a diagram showing reverberation characteristics and overall sensitivities based on Experimental Examples 2 to 5 and Comparative Example 2.
Figure 7:
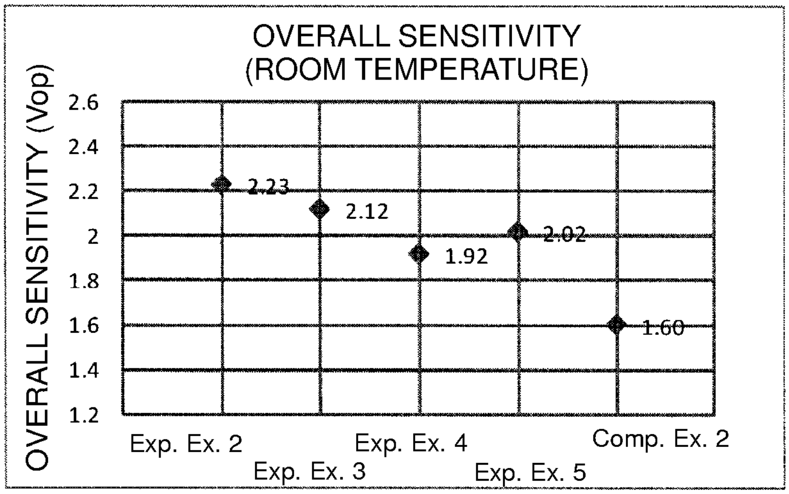

FIG. 7 shows the experiment results under the conditions shown in Table 2. The number of samples used for the experiment is 5. Numerical values in the drawing indicate average values. It should be noted that the value of reverberation characteristic required for an ultrasonic transducer is, for example, about 1.4 ms or less at room temperature. The value of required overall sensitivity is, for example, about 1.2 Vop or more at room temperature.

Comparing Experimental Example 2, Experimental Examples 3 to 5, and Comparative Example 2, it can be appreciated that the reverberation characteristic improves as the distance h decreases from λ/4. That is, it can be said that the distance h from the farthest location of the substantially pyramidal recesses 10*a* from the piezoelectric element 2 to the piezoelectric element 2 affects the reverberation characteristic. This is because when the distance h is λ/4 or less, no resonance takes place, which is advantageous for attenuating ultrasonic waves.

However, in the case where the molded body 10 and the piezoelectric 2 contact each other as in Comparative Example 2, although the reverberation characteristic improves, the overall sensitivity significantly decreases, to 1.60 Vop. From this, it can be said that it is effective to set the distance h within the range from a value that does not hinder operation of the piezoelectric element 2 to λ/4.

As shown in Table 2, Experimental Examples 6 to 10 are samples that differ from Experimental Example 2 in the number of protrusions 10*c*. Around the outer periphery of the substantially pyramidal recesses 10*a*, the protrusions 10*c* are provided at a fixed gap so as to be symmetric with respect to a point, and the area in which the piezoelectric element 2 is held is varied. The reverberation characteristics and overall sensitivities of these samples at room temperature are measured and compared with each other.

Figure 8:
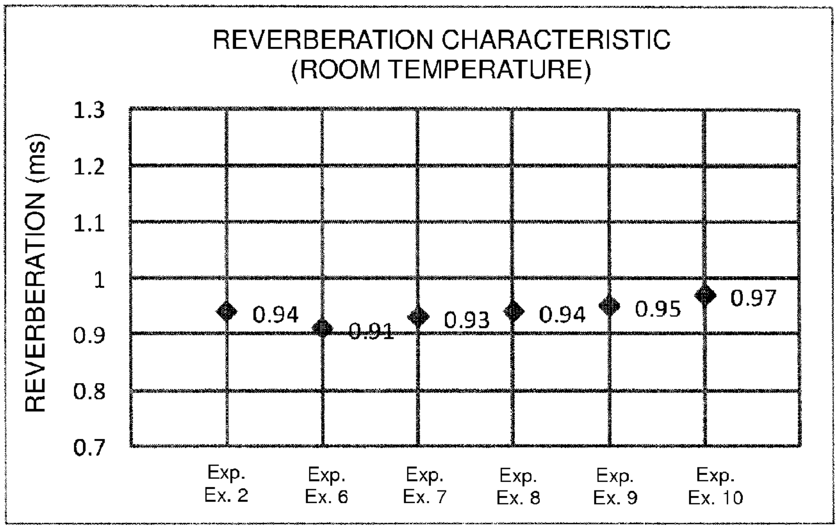
FIG. 8 is a diagram showing reverberation characteristics and overall sensitivities based on Experimental Example 2 and Experimental Examples 6 to 10.
Figure 8:
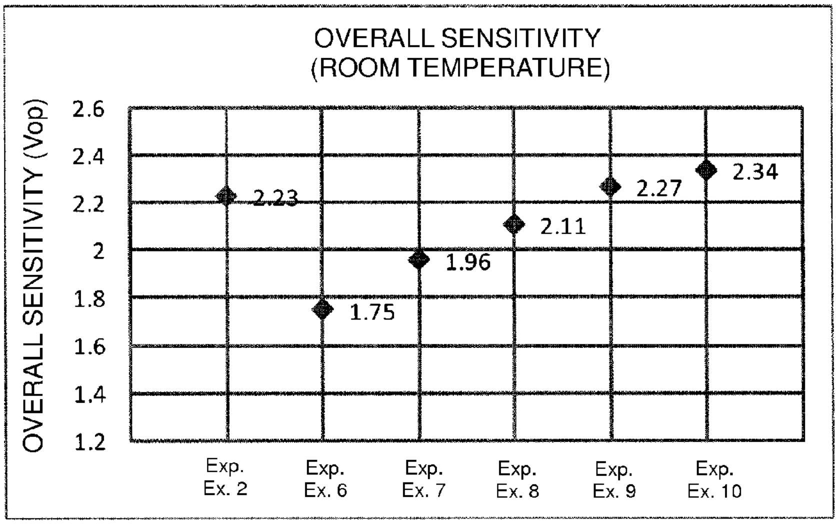

FIG. 8 shows the experiment results under the conditions shown in Table 2. The number of samples used for the experiment is 5. Numerical values in the drawing indicate average values. It should be noted that the value of reverberation characteristic required for an ultrasonic transducer is, for example, about 1.4 ms or less at room temperature. The value of required overall sensitivity is, for example, about 1.2 Vop or more at room temperature.

Comparing Experimental Example 2 and Experimental Examples 6 to 10, it can be appreciated that the overall sensitivity increases stepwise by progressively reducing the locations where the protrusions 10*c* are provided, from the entire outer periphery to 12, 8, 6, 4, and 0. This is due to the fact that the area in which vibration of the piezoelectric element 2 is suppressed becomes shorter. In this regard, when the number of protrusions 10*c* is 0, although the overall sensitivity is best, the reverberation characteristic is worst. This is due to the tradeoff relationship that exists between the reverberation characteristic and the overall sensitivity.

On the other hand, when the number of protrusions is 4, the overall sensitivity is relatively high at 2.23 Vop, and reverberation at room temperature is also sufficiently suppressed at 0.94 ms. From this, it can be said that the number of protrusions 10*c* is desirably 4.

While in this experiment the experiment was conducted while setting the locations where the protrusions 10*c* are provided to 0, 4, 6, 8, 12, and the entire outer periphery, this should not be construed restrictively. For example, the protrusions 10*c* may be placed at two locations, or at odd-numbered locations.

Modification 1 of Embodiment 1

Figure 9:
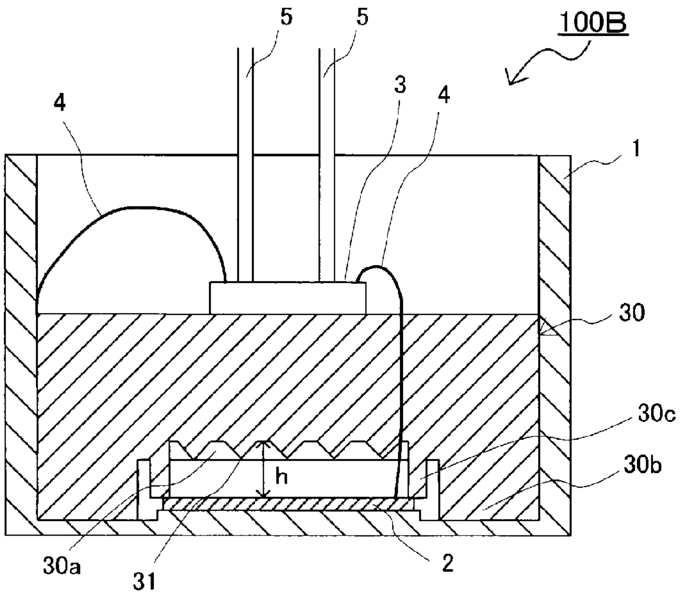
FIG. 9 is a schematic cross-sectional view of an ultrasonic transducer according to Modification 1 of Embodiment 1.

FIG. 9 is a cross-sectional view of an ultrasonic transducer 100B according to Modification 1 of Embodiment 1. Portions that are the same as those in Embodiment 1 are denoted by the same symbols and repetitive description is omitted.

The ultrasonic transducer 100B according to this modification includes a case 1, a piezoelectric element 2, a base substrate 3, lead wires 4, external connection terminals 5, and a molded body 30.

The main surface of the molded body 30 which is opposed to the piezoelectric element 2 is provided with a large number of substantially truncated pyramidal recesses 30*a*, legs 30*b*, and protrusions 30*c*.

Specifically, the large number of substantially truncated pyramidal recesses 30*a* are provided in a substantially circular region at the center of the main surface of the molded body 30, and are formed at regular intervals in a substantially grid pattern. The molded body 30 is placed in such a way that a large number of irregularities 31 where the substantially truncated pyramidal recesses 30*a* are provided do not come into contact with the piezoelectric element 2. The shape of the substantially truncated pyramidal recesses 30*a* is substantially a square frustum. This configuration makes manufacture and machining of the molded body easy.

While in the above-mentioned embodiment a gap is left between the molded body and the inside of the case to facilitate entry of the filler silicone, this should not be construed restrictively. For example, the molded body may be formed to be in one size larger than the case, and fitted into the case.

While in the above-mentioned embodiment silicone resin is used as the material of the molded body, this should not be construed restrictively. For example, a closed-cell/open-cell foam such as urethane, or synthetic fiber such as felt may be used.

Embodiment 2

Figure 10:
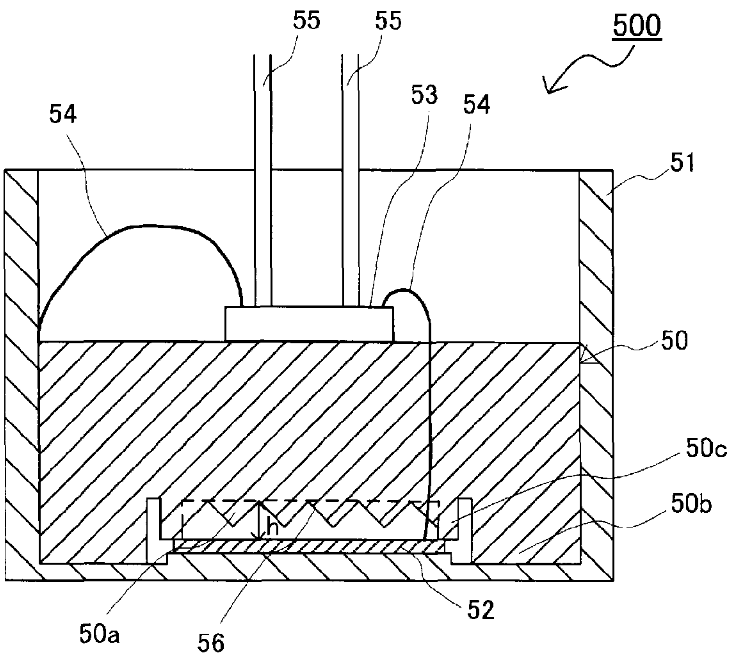
FIG. 10 is a schematic cross-sectional view of an ultrasonic transducer according to Embodiment 2 of the present invention.

FIG. 10 is a cross-sectional view of an ultrasonic transducer 500 according to Embodiment 2. The ultrasonic transducer 500 according to this embodiment includes a case 51, a piezoelectric element 52, a base substrate 53, lead wires 54, external connection terminals 55, and a molded body 50.

The main surface of the molded body 50 which is opposed to the piezoelectric element 52 is provided with a large number of irregularities 56 formed by a large number of substantially pyramidal projections 50*a*, legs 50*b*, and protrusions 50*c*.

Embodiment 2 differs from Embodiment 1 in the shape of the molded body 50.

Specifically, the large number of substantially pyramidal projections 50*a* are provided in a substantially circular region at the center of the main surface of the molded body 50, and are formed at regular intervals in a substantially grid pattern. The molded body 50 is placed in such a way that the substantially pyramidal projections 50*a* do not come into contact with the piezoelectric element 52. The shape of the substantially pyramidal projections 50*a* is substantially a square pyramid. With this configuration, the same effect as that of Embodiment 1 is obtained.

Modification 1 of Embodiment 2

Figure 11:
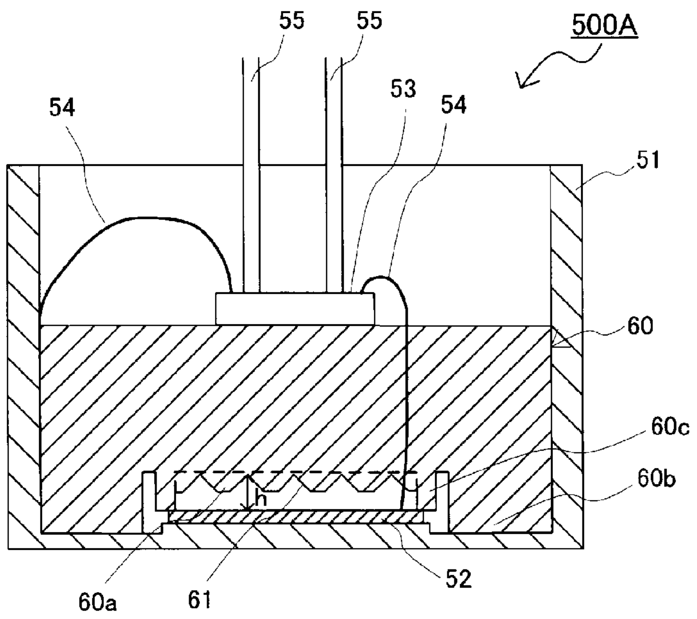
FIG. 11 is a schematic cross-sectional view of an ultrasonic transducer according to Modification 1 of Embodiment 2.
Figure 12:
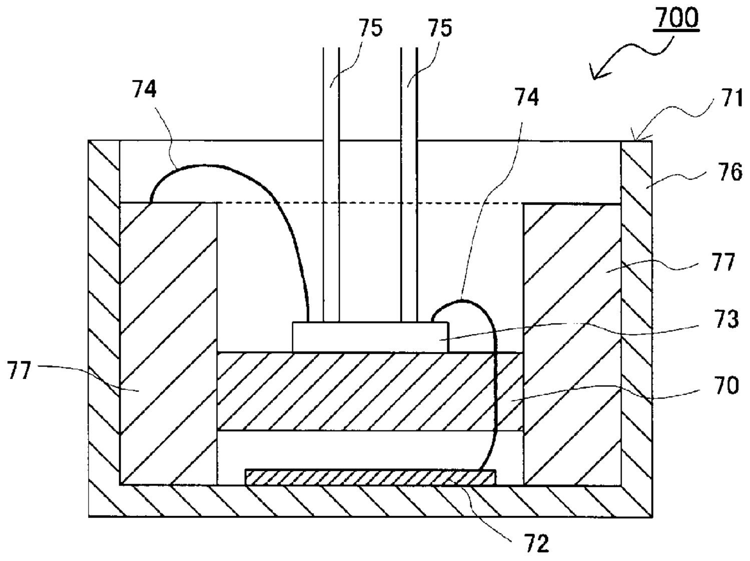
FIG. 12 is a schematic cross-sectional view of the related art.

FIG. 11 is a cross-sectional view of an ultrasonic transducer 500A according to Modification 1 of Embodiment 2. Portions that are the same as those in Embodiment 2 are denoted by the same symbols and repetitive description is omitted.

The ultrasonic transducer 500A according to this modification includes a case 51, a piezoelectric element 52, a base substrate 53, lead wires 54, external connection terminals 55, and a molded body 60.

The main surface of the molded body 60 which is opposed to the piezoelectric element 52 is provided with a large number of irregularities 61 formed by a large number of substantially truncated pyramidal projections 60*a*, legs 60*b*, and protrusions 60*c*.

Specifically, the large number of substantially truncated pyramidal projections 60*a* are provided in a substantially circular region at the center of the main surface of the molded body 60, and are formed at regular intervals in a substantially grid pattern. The molded body 60 is placed in such a way that the substantially truncated pyramidal projections 60*a* do not come into contact with the piezoelectric element 52. The shape of the substantially truncated pyramidal projections 60*a* is substantially a square frustum. This configuration makes manufacture and machining of the molded body easy.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. An ultrasonic transducer comprising:
a case having a closed end in a main axis direction thereof;
a piezoelectric element located substantially at a center of the closed end of the case; and
a body arranged inside the case so as to be opposed to the piezoelectric element,
wherein the body has an irregular surface portion opposed to and spaced from the piezoelectric element,
wherein the body has a plurality of legs located around an outer periphery of the irregular surface portion.

2. The ultrasonic transducer according to claim 1, wherein the case has a substantially cylindrical shape.

3. The ultrasonic transducer according to claim 1, wherein the body is a molded body.

4. The ultrasonic transducer according to claim 3, wherein the molded body is formed of silicone resin.

5. The ultrasonic transducer according to claim 1, wherein the irregular surface portion includes a plurality of irregularities having a substantially pyramidal shape.

6. The ultrasonic transducer according to claim 5, wherein the plurality of irregularities are arranged at regular intervals.

7. The ultrasonic transducer according to claim 1, wherein the irregular surface portion includes a plurality of irregularities having a substantially truncated pyramidal shape.

8. The ultrasonic transducer according to claim 7, wherein the plurality of irregularities are arranged at regular intervals.

9. The ultrasonic transducer according to claim 1, wherein the plurality of legs are configured to contact the closed end of the case.

10. An ultrasonic transducer comprising:
a case having a closed end in a main axis direction thereof;
a piezoelectric element located substantially at a center of the closed end of the case; and
a body arranged inside the case so as to be opposed to the piezoelectric element,
wherein the body has an irregular surface portion opposed to and spaced from the piezoelectric element,
wherein the body has:
a plurality of legs located around an outer periphery of the irregular surface portion, the plurality of legs being configured to contact the closed end of the case; and
at least one protrusion located around the outer periphery of the irregular surface portion, the at least one protrusion being configured to contact a surface of the piezoelectric element.

11. The ultrasonic transducer according to claim 1, wherein the molded body is arranged inside the case such that a distance between the irregular surface portion and the piezoelectric element is not more than a ¼ wavelength of ultrasonic waves of the piezoelectric element.

12. An ultrasonic transducer comprising:
a case having a closed end in a main axis direction thereof;
a piezoelectric element located substantially at a center of the closed end of the case; and
a body arranged inside the case so as to be opposed to the piezoelectric element,
wherein the body has an irregular surface portion opposed to and spaced from the piezoelectric element,
wherein the body has at least one protrusion located around an outer periphery of the irregular surface portion.

13. The ultrasonic transducer according to claim 12, wherein the at least one protrusion is configured to contact a surface of the piezoelectric element.

14. The ultrasonic transducer according to claim 12, wherein the case has a substantially cylindrical shape.

15. The ultrasonic transducer according to claim 12, wherein the body is a molded body.

16. The ultrasonic transducer according to claim 15, wherein the molded body is formed of silicone resin.

17. The ultrasonic transducer according to claim 12, wherein the irregular surface portion includes a plurality of irregularities having a substantially pyramidal shape.

18. The ultrasonic transducer according to claim 17, wherein the plurality of irregularities are arranged at regular intervals.

19. The ultrasonic transducer according to claim 12, wherein the irregular surface portion includes a plurality of irregularities having a substantially truncated pyramidal shape.

20. The ultrasonic transducer according to claim 19, wherein the plurality of irregularities are arranged at regular intervals.

* * * * *